US008592102B2

(12) United States Patent
Lin et al.

(10) Patent No.: US 8,592,102 B2
(45) Date of Patent: Nov. 26, 2013

(54) COST-EFFECTIVE METHOD FOR EXTREME ULTRAVIOLET (EUV) MASK PRODUCTION

(75) Inventors: Chin-Hsiang Lin, Hsinchu (TW);
Heng-Jen Lee, Hsinchu County (TW);
I-Hsiung Huang, Hukou Shiang (TW);
Chih-Chiang Tu, Tauyen (TW);
Chun-Jen Chen, Renwu Township, Kaohsiung County (TW); Rick Lai, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 437 days.

(21) Appl. No.: 12/650,985

(22) Filed: Dec. 31, 2009

(65) Prior Publication Data
US 2011/0159410 A1    Jun. 30, 2011

(51) Int. Cl.
*G03F 1/24* (2012.01)
*G03F 1/72* (2012.01)
*G03F 1/84* (2012.01)

(52) U.S. Cl.
USPC ................................. 430/5; 716/52

(58) Field of Classification Search
USPC ........................................ 430/4–5
See application file for complete search history.

(56) References Cited

U.S. PATENT DOCUMENTS

| 6,660,653 B1* | 12/2003 | Tzu et al. ............... 430/5 |
| 7,123,356 B1 | 10/2006 | Stokowski et al. |
| 2008/0318138 A1* | 12/2008 | Holfeld ................. 430/5 |

OTHER PUBLICATIONS

Hector et al., "Shifting Pattern Data to Avoid Mask Blank Defects", published Nov. 20, 2001 at www.IP.com, all 5 pages.*
Carl Hess et al., "Wafer Plane Inspection with Soft Resist Thresholding," Photomask Technology 2008, Proc. of SPIE vol. 7122, 71221C, 11 pages.
Emily Gallagher et al., "Wafer Plan Inspection Evaluated for Photomask Production," Photomask W Technology 2008, Proc. of SPIE vol. 7122, 71221B, 9 pages.
Carl Hess et al., "High Resolution Inspection with Wafer Plan Die: Database Defect Detection," Photomask Technology 2008, Proc. of SPIE vol. 7122, 71221A, 11 pages.

* cited by examiner

*Primary Examiner* — Mark F Huff
*Assistant Examiner* — John S Ruggles
(74) *Attorney, Agent, or Firm* — Haynes and Boone, LLP

(57) ABSTRACT

The present disclosure provides for many different embodiments. An exemplary method can include providing a blank mask and a design layout to be patterned on the blank mask, the design layout including a critical area; inspecting the blank mask for defects and generating a defect distribution map associated with the blank mask; mapping the defect distribution map to the design layout; performing a mask making process; and performing a mask defect repair process based on the mapping.

13 Claims, 6 Drawing Sheets

COST-EFFECTIVE METHOD FOR EXTREME ULTRAVIOLET (EUV) MASK PRODUCTION

BACKGROUND

In semiconductor technologies, a plurality of photomasks (masks) are formed with predesigned integrated circuit (IC) patterns. The plurality of masks are used to transfer those predesigned IC patterns to multiple semiconductor wafers in lithography processes. The predesigned IC patterns formed on the masks are master patterns. Any defect on a photomask will be transferred to multiple semiconductor wafers and cause yield issues. Therefore, the fabrication of a mask utilizes a high precision process. Further inspection and follow-up repair are also implemented to ensure that each mask is fabricated with high quality. However, existing practices on inspection and repairing of a mask are time-consuming and costly. Accordingly, what is needed is a method and system that addresses the above stated issues.

SUMMARY

The present disclosure provides for many different embodiments. An exemplary method can include providing a blank mask and a design layout to be patterned on the blank mask, the design layout including a critical area; inspecting the blank mask for defects and generating a defect distribution map associated with the blank mask; mapping the defect distribution map to the design layout; performing a mask making process; and performing a mask defect repair process based on the mapping.

Another exemplary method can include providing a design layout, the design layout being a pattern for a layer of an integrated circuit device; providing a plurality of blank masks, each blank mask being associated with a defect distribution map; and selecting a blank mask from the plurality of blank masks. Selecting the blank mask can be based on comparing the design layout to the defect distribution map of each blank mask, such that the selected blank mask minimizes defect repair requirements. The method can further include transferring the design layout to the selected blank mask, thereby fabricating a mask.

An exemplary system for implementing the methods described herein can include a mask inspection system; a mask making system; a mask repair system; and an auto-mapping system including a design layout management system designed to compare a design layout to a mask a defect distribution map from the defect inspection system, wherein the auto-mapping system communicates with the mask making system and mask repair system.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
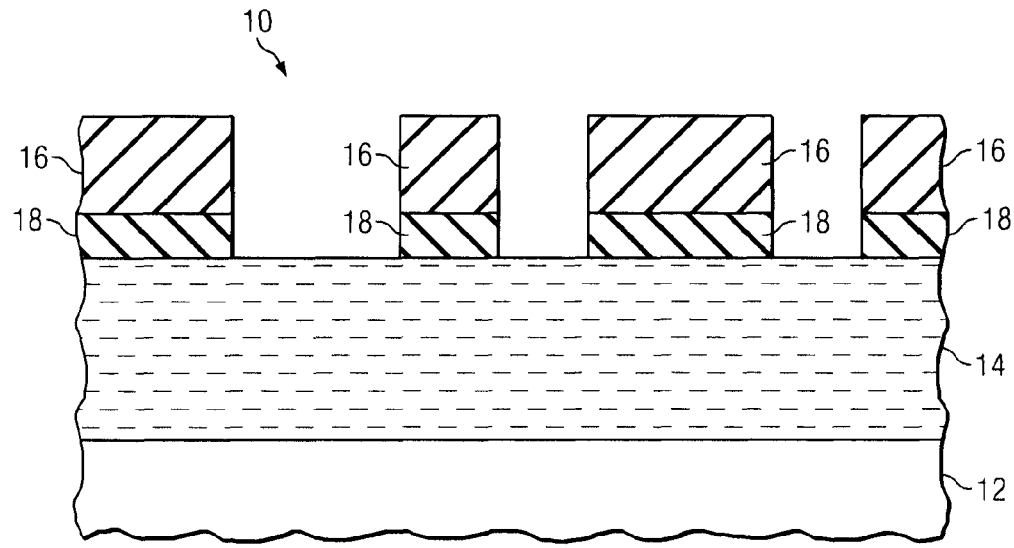
FIG. 1 is a cross-sectional view of an embodiment of a mask according to aspects of the present disclosure.

The present disclosure relates generally to mask manufacturing systems, and more particularly, to a method for reducing mask defect repair requirements.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

A mask fabrication process includes a blank mask fabrication process and a mask patterning process. During the blank mask fabrication process, a blank mask is prepared by coating a suitable substrate with suitable layers (e.g., multiple reflective layers). The blank mask (referred to as a mask, photomask, or reticle) is patterned during the mask fabrication process to have a design of a layer of an integrated circuit (IC) device (or chip). The patterned mask is then used much like a photographic negative to transfer circuit patterns (i.e., the design of a layer of an IC device) onto a semiconductor wafer. The patterns can translate into tiny transistors, electrical circuits, and/or other devices/circuits that make up a final IC device. The pattern can be transferred over and over onto multiple wafers through various lithography processes. Several masks (for example, a set of 15 to 30 masks) may be used to construct a complete IC device.

Various masks may be fabricated for use in various processes. For example, extreme ultraviolet (EUV) lithography processes utilize exposure wavelengths less than approximately 150 nm. EUV lithography can be used to print features with smaller critical dimensions (CD) than other techniques. A unique set of challenges arises from masking and reflection of EUV radiation. For example, most condensed materials absorb at the EUV wavelength, so a reflective mask may be needed for EUV lithography processes.

FIG. 1 illustrates an EUV blank mask 10. The EUV blank mask comprises a low thermal expansion material (LTEM) layer 12 (e.g., quartz) as an underlying substrate and a reflective multilayer (ML) coating 14 disposed over the LTEM layer 12. The reflective ML coating 14 (also referred to as a mirror) comprises a number of alternating material layers. The material layers may exhibit differing EUV reflectivity constants. An exemplary ML coating can include forty pairs of alternating molybdenum and silicon (Mo—Si) layers. An absorber layer 16 (such as a TaN material layer) is disposed over the reflective ML layer 14. A buffer layer 18 (e.g., a silicon dioxide layer) may be disposed between the ML coating and the absorber layer to protect the ML coating during the mask patterning process. A desired pattern for the EUV mask is defined by selectively removing portions of the absorber layer 16 (and buffer layer 18) to uncover portions of the underlying ML coating 14 on the substrate 12, providing a patterned EUV mask as illustrated in FIG. 1. The absorber layer 16 may be selectively removed by a combination of patterning (e.g., laser-beam and/or electron-beam writing) and etching (e.g., wet and/or dry etching) processes.

One of the challenges in EUV lithography involves minimizing geometric defects, or the effects thereof, that may be present in the substrate 12 or multiple layers of the ML coating 14. Detecting embedded defects within the ML coating 14 is difficult, and locations of the embedded defects can be critical. For example, a defect embedded in a layer of the ML coating 14 that is underneath the remaining absorber layer 16 and/or near the substrate 12 will pose less risk to a pattern formed on a wafer with the patterned EUV blank mask. In contrast, a defect embedded in a layer of the ML coating 14 where the absorber layer 16 is removed and/or near the exposed surface of the ML coating 14 will introduce defects into the patterned EUV blank mask, which in turn introduces defects into an IC layer patterned using the patterned EUV blank mask. Typically, after embedded defects are detected, the defects can be repaired. This process can be expensive and time consuming.

The present disclosure provides an effective method and system for detecting blank mask defects and utilizing defect information to minimize defect repair requirements. For example, the proposed method and system can effectively select a best suitable blank mask for a specific layer requirement. In another example, the proposed method and system can sort and manage a plurality of blank masks and a plurality of design layouts to be pattered on the plurality of blank masks, matching each blank mask with a design layout that can minimize defect repair requirements.

Figure 2:
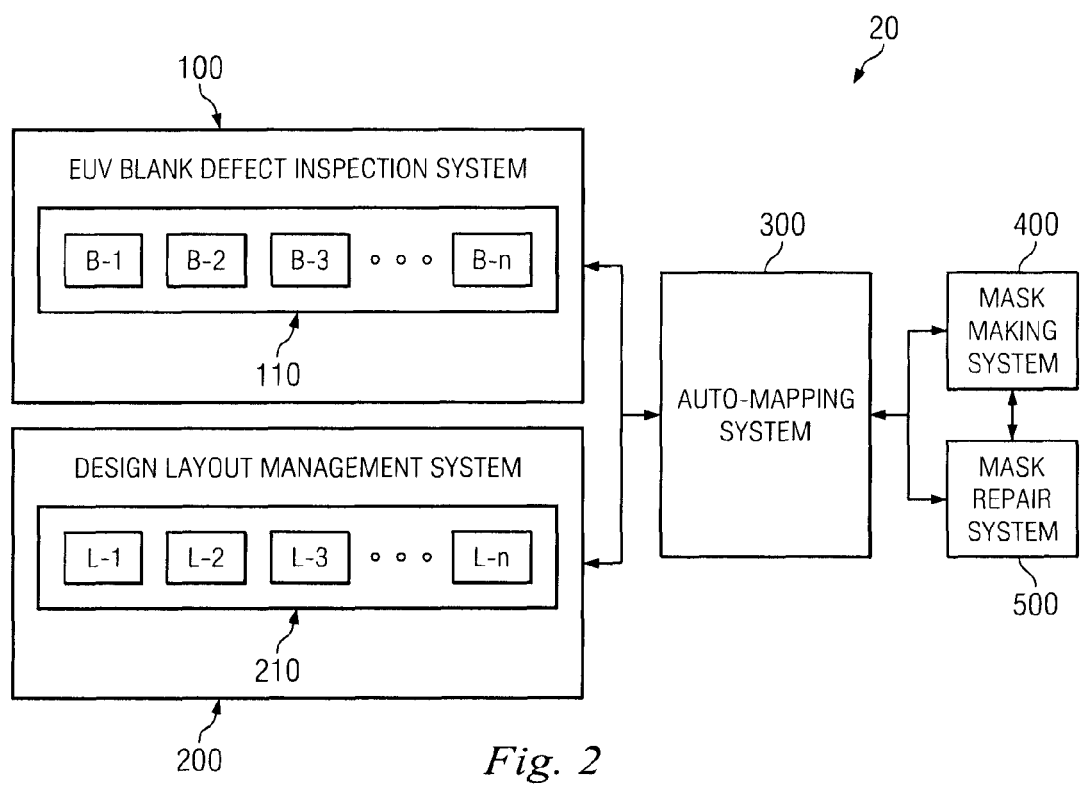
FIG. 2 is a block diagram of a mask manufacturing system in which various embodiments disclosed herein are implemented

FIG. 2 illustrates a portion of an integrated circuit manufacturing system 20 that implements a mask manufacturing process. The mask manufacturing process can implement a blank mask fabrication process and mask patterning process to fabricate a plurality of masks. In the present example, the mask patterning process transfers a design layout for a layer of an IC device to an EUV blank mask. The system 20 can optimize an EUV blank mask with a design layout, reducing defect repair requirements.

The system 20 comprises a plurality of entities (or modules). For example, illustrated for the sake of simplicity and clarity, the entities of the system 20 can include an EUV blank defect inspection system 100, a design layout management system 200, an auto-mapping system 300, a mask making system 400, and a mask repair system 500. Each of the systems 100, 200, 300, 400, 500 can include various modules and/or tools, and each of the systems 100, 200, 300, 400, 500 can communicate with one another over a network. The communications network may be a single network or may be a variety of different networks, such as an intranet and the Internet, and may include both wired and wireless communication channels. Each entity may interact with other entities and may provide services to and/or receive services from the other entities.

Each of the systems 100, 200, 300, 400, 500 may include one or more computing devices, such as a personal computer, personal digital assistant, pager, cellular telephone, other suitable computing device, and/or combinations thereof. For example, entities 100, 200, 300, 400, and 500 comprise computer systems and/or computers. The computing devices may include a central processing unit (CPU), a memory unit, an input/output (I/O) device, and/or a network interface. Such components may be interconnected by a bus system. It is understood that each computer system may be differently configured and that each of the listed components represent several different components. For example, the CPU may include a multi-processor or a distributed processing system; the memory unit may include different levels of cache memory, main memory, hard disks, and/or remote storage locations; the I/O device may include monitors and/or keyboards; and the network interface may be a modem, a wireless transceiver, and/or one or more network interface cards. Because the computing devices may be connected to the network, certain components may, at times, be shared with other devices. Therefore, a wide range of flexibility is anticipated in the configuration of the computing devices. In an example, the computing devices may act as a server to other devices.

The EUV blank mask defect inspection system 100 includes an EUV blank mask database 110. The EUV blank mask defect inspection system 100 includes a suitable module (system, or apparatus) for detecting defects in an EUV blank mask. The mask defect inspection system 100 aims to identify mask defects for mask repair and enhance mask fabrication yield. The defect inspection module can use radiation of varying wavelengths and optics to detect defects in an EUV blank mask. For example, the defect inspection module may irradiate an EUV blank mask with radiation and then determine where defects are located in the EUV blank mask based on the radiation reflected from the EUV blank mask. The radiation utilized for defect inspection includes deep ultraviolet (DUV) radiation, extreme ultraviolet (EUV) radiation, e-beam radiation, other suitable radiations, and/or combinations thereof. Exemplary DUV radiation include wavelengths of approximately 365 nm, 257 nm, 193, nm, 126 nm, and/or other suitable wavelengths. Exemplary EUV and/or e-beam radiation includes wavelengths from about 10 to about 15 nm, such as about 13.5 nm. Once the EUV blank mask is inspected, defect information associated with the inspected EUV blank mask can be stored in the EUV blank mask database 110. The inspecting process can utilize a variety of inspection criteria.

The EUV blank mask database 110 stores defect information about a plurality of EUV blank masks, such as EUV blank mask 1 (B-1), EUV blank mask 2 (B-2), EUV blank mask 3 (B-3), . . . EUV blank mask n (B-n), and so forth. The defect information can include a blank defect distribution map and/or defect classification report for each EUV blank mask. The blank defect distribution map provides locations, sizes, and depths of each defect found in the EUV blank mask. The blank defect distribution map may provide additional information about the defects found in each EUV blank mask. In an example, referring to patterned EUV blank mask 10, the blank defect distribution map may indicate that a defect is in a layer of the ML coating 14 (such as in layer 80). The blank defect distribution map may further indicate that the defect in the layer of ML coating 14 is located under a portion of absorber layer 16 (i.e., where absorber layer 16 has not been removed). As noted above, this defect poses a lower risk with respect to affecting a patterned layer. In another example, the blank defect distribution map may indicate that a defect is in a layer of the ML coating 14, near a top portion of ML coating 14. The blank defect distribution map may further indicate that the defect in the layer of ML coating 14 is located where absorber layer 16 has been removed, in an area where EUV radiation is reflected. As noted above, this defect poses a higher risk with respect to affecting a patterned layer. The defect classification report can classify each defect, for example, by classifying the risk of the defect affecting a patterned layer (e.g., low, high, medium). Other classifications/map characteristics are contemplated, and the EUV blank mask database 110 may compile information about the EUV blank masks, such as compiled defect classification reports or defect distribution maps.

The design layout management system 200 includes a design layout database 210. The design layout database 210 stores a plurality of design layouts, such as design layout 1 (L-1), design layout 2 (L-2), design layout 3 (L-3), . . . design layout n (L-n), and so forth. Each design layout provides a design (or pattern) for a layer of an IC device. For example, a design layout provides a pattern for an active layer, a polysilicon layer, a contact/via layer, and/or a metal layer of an IC device. The design layouts are in any suitable file format, such as GDSII and/or write file format (e.g., MEBES). The design layouts are patterned on EUV blank masks, which as noted above, may exhibit defect areas. Each design layout includes a circuit area and a dummy area. When a circuit area of the design layout will be formed on a portion of the EUV blank mask that exhibits defects, the defects in this area will likely need to be repaired. When a dummy area of the design layout will be formed on a portion of the EUV blank mask that exhibits defects, mask repair of that defect may not be necessary.

The auto-mapping system 300 communicates with the EUV blank defect inspection system 100, design layout management system 200, mask making system 400, and/or mask repair system 500. The auto-mapping system 300 can optimize an EUV blank mask with a design layout, reducing defect repair requirements. The auto-mapping system 300 can control various processes within the system 300. As noted above, the auto-mapping system 300 may include a computer that can be a conventional, commercially-available computer, or any other suitable computer hardware. The hardware of the auto-mapping system 300 can include a processor and a memory. The memory can store a computer program that is executed by the processor, and that causes the computer to perform various actions. For example, the computer may be operable to perform actions including sorting information, managing information, manipulating information (including manipulating information using a model), receiving information, storing information, and transferring information. The actions performed by (and/or capabilities of) the auto-mapping system 300 will be described in more detail below.

The mask making system 400 can perform data processing of a design layout of a layer of an IC device to generate a mask pattern, manufacturing a mask based on the generated mask pattern. The mask making system 400 includes various modules for manufacturing a mask, such as an exposure module, a deposition module, an etching module, etc. In the present example, the mask making system 400 manufactures EUV masks, and thus, patterns EUV blank masks with various design layouts. The mask making system 400 can pattern the EUV blank mask by writing the design pattern on the absorption layer using a mask writing technique, such as e-beam writing. Other writing techniques such as ion beam writing may alternatively be used to form the mask pattern. When the mask making system 400 receives a design layout for generating a mask pattern, the mask making system 400 patterns a suitable EUV blank mask based on communication with the auto-mapping system 300, which will be described in more detail below.

The mask repair system 500 can repair defect found in the masks. The mask repair system 500 is a suitable system, such as an e-beam repair system and/or a focused ion beam (FIB) repair system. In other examples, the mask repair system 500 may utilize a laser beam for mask repairing and/or a microscope (MSF) micromachine for mask repairing. The mask repair system 500 may receive a repair reference report from the auto-mapping system 300, which details the defect repair requirements for each mask. The mask repair system 500 may also receive a repair reference report from a mask inspection tool, which inspects the blank mask and/or patterned mask.

Figure 3:
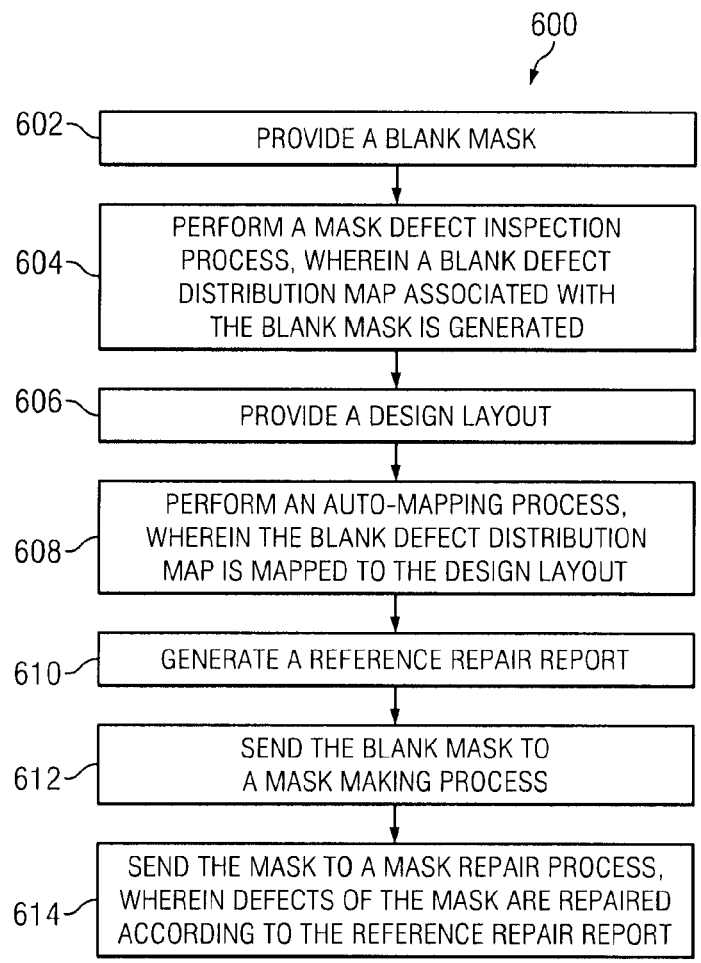
FIGS. 3-8 illustrate a mask manufacturing process that implements an auto-mapping process according to one or more embodiments of the present disclosure.
Figure 4:
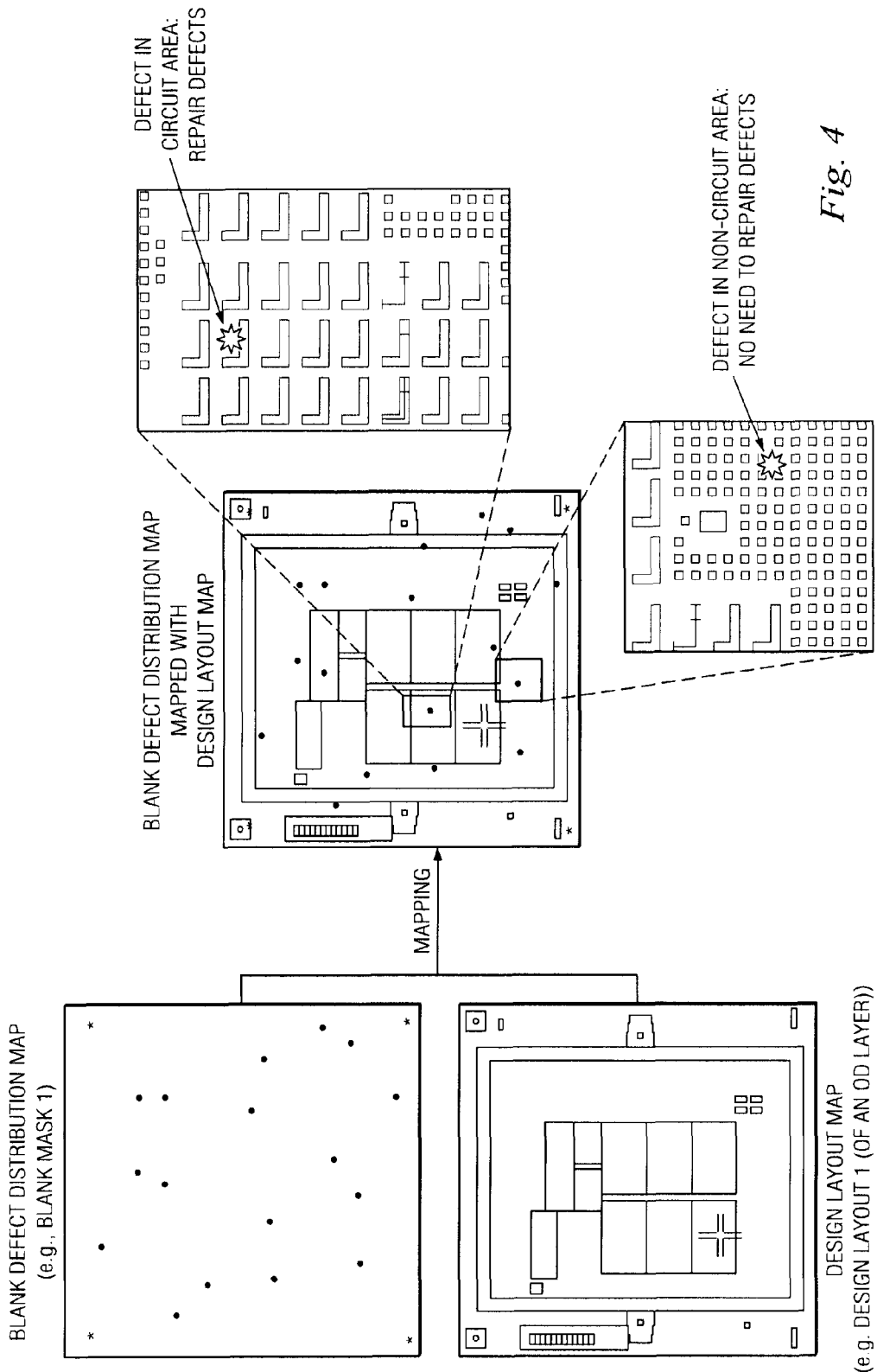

FIGS. 3 and 4 illustrate a method that can be implemented by the system 20 of FIG. 2 according to one or more embodiments of the present disclosure. FIG. 3 illustrates a method 600 that provides an EUV blank mask associated with an EUV blank defect distribution map, wherein the EUV blank mask defect distribution map is compared to a design layout to be patterned on the EUV blank mask. From the comparison, it is determined whether any defects exhibited by the EUV blank mask are in a circuit area of the design layout to be patterned. A reference repair report may be generated, which details the defects found in the EUV blank mask. This can increase mask inspection and manufacturing time by allowing the system to locate and repair EUV blank mask defects that will be found only within the circuit areas of the design layout to be patterned on the EUV blank mask. Put another way, if defects are discovered in a dummy area of the design layout to be patterned on the EUV blank mask, then the system can determine it is not necessary to repair these defects.

More specifically, at blocks 602 and 604, a blank mask is provided, and a mask defect inspection process is performed on the blank mask. For example, an EUV blank mask is provided to the EUV blank defect inspection system 100. The EUV blank mask can include a substrate, multi-layer coating, buffer layer, and/or absorber layer as illustrated in FIG. 1. The EUV blank defect inspection system 100 performs a mask defect inspection process on the EUV blank mask, inspecting the EUV blank mask for defects. From the defect inspection process, the EUV blank defect inspection system 100 generates an EUV blank mask defect distribution map. This map provides information about the defects found within the EUV blank mask. For example, the map provides a location, size, and/or depth of each defect present in the provided EUV blank mask. It is contemplated that the EUV blank mask defect distribution map can provide additional data associated with each defect.

At block 606, a design layout is provided. For example, the design layout is provided by the design layout management system 200. The design layout provides a pattern for a layer of an IC device, such as for an active layer, a polysilicon layer, a contact layer, a via layer, a metal layer, and/or other suitable layer of an IC device. The provided IC design layout will be patterned on the provided EUV blank mask. As noted above, the design layout can include a circuit area and a dummy area, which will be patterned on the EUV blank mask. If the circuit area will be patterned on a portion of the EUV blank mask that exhibits defects, the defects in this area will need to be repaired. Thus, the method 600 can determine whether a circuit area of the design layout will be patterned on a defect area of the provided EUV blank mask.

At block 608, an auto-mapping process is performed, where the defect distribution map of the provided EUV blank mask is compared to the design layout that will be patterned on the EUV blank mask. The EUV blank defect inspection system 100 provides the defect distribution map of the provided EUV blank mask to the auto-mapping system 300, and the design layout management system 200 provides the design layout to the auto-mapping system 300. Referring to FIG. 4, as an example, the EUV blank defect inspection system 100 provides a blank defect distribution map for a Blank Mask 1, and the design layout management system 200 provides a design layout map of Design Layout 1. Design Layout 1 provides a design layout of an active (OD) layer. The auto-mapping system 300 takes the blank defect distribution map and maps it to the design layout. The mapping process aligns the design layout with the EUV blank defect distribution map, indicating where various features of the design layout will be formed on the EUV blank mask. Thus, the mapping process can reveal what portions of the design layout will be formed in an area where defects exist in the EUV blank mask.

At block 610, a reference repair report is generated. The reference repair report can be generated by the auto-mapping system 300. The reference repair report can indicate information about defects of the EUV blank mask and/or information about the location, size, and depth of the defects in relation to the design layout. More particularly, from the mapping process, the auto-mapping system 300 determines whether any blank mask defects map to a circuit area of the design layout. If the circuit area of the design layout will only be patterned in areas of the EUV blank mask that are free of defects, then it is possible that no mask repairing is necessary. If the circuit area of the design layout will be patterned in areas of the EUV blank mask that exhibit defects, a mask repairing process of those areas of the EUV blank mask will be necessary. As illustrated in FIG. 4, some EUV blank mask defects are within the circuit area of the design layout, and some EUV blank mask defects are within the dummy area of the design layout. Accordingly, the reference repair report can indicate that the defects within the circuit area need to be repaired (indicating the location, size, and/or depth of the defects) and the defects within the dummy area do not need to be repaired (indicating the location, size, and/or depth of the defects).

At block 612, the blank mask is sent to a mask making system to undergo a mask making process. The EUV blank mask is subjected to various deposition, patterning, and/or etching processes to form the provided design layout on the EUV blank mask, resulting in a finished mask. For example, the EUV blank mask is provided to the mask making system 400, where the EUV blank mask (e.g., Blank Mask 1) is patterned with the design layout (e.g., Design Layout 1, an OD layer pattern). Subsequently, the mask can be sent to a mask inspection system for further defect inspection.

At block 614, the mask (or patterned mask) is sent to a mask repair system, such as mask repair system 500, for a mask repair process. The mask repair process corrects defects in the mask according to the reference repair report, such as the reference repair report generated by the auto-mapping system 300. The mask repair process may further correct defects in the mask according to a report generated by the post-patterning mask inspection process. In the present example, referring to FIG. 4, the mask repair system 500 will repair the defects within the circuit area of the mask as designated by the reference repair report.

Figure 5:
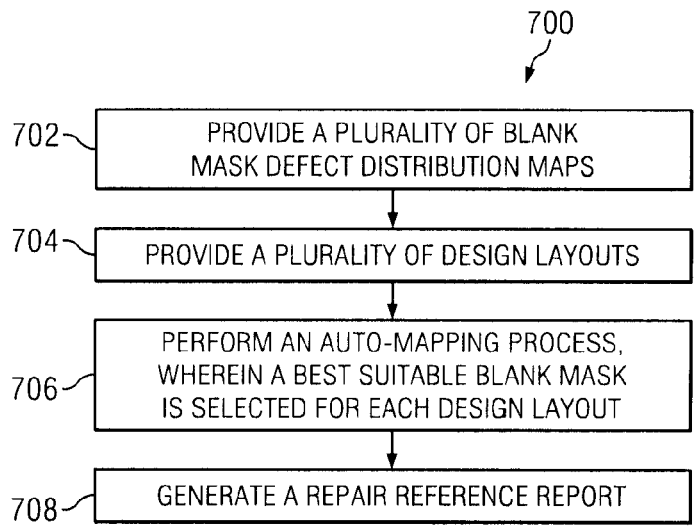
Figure 6:
Figure 7:
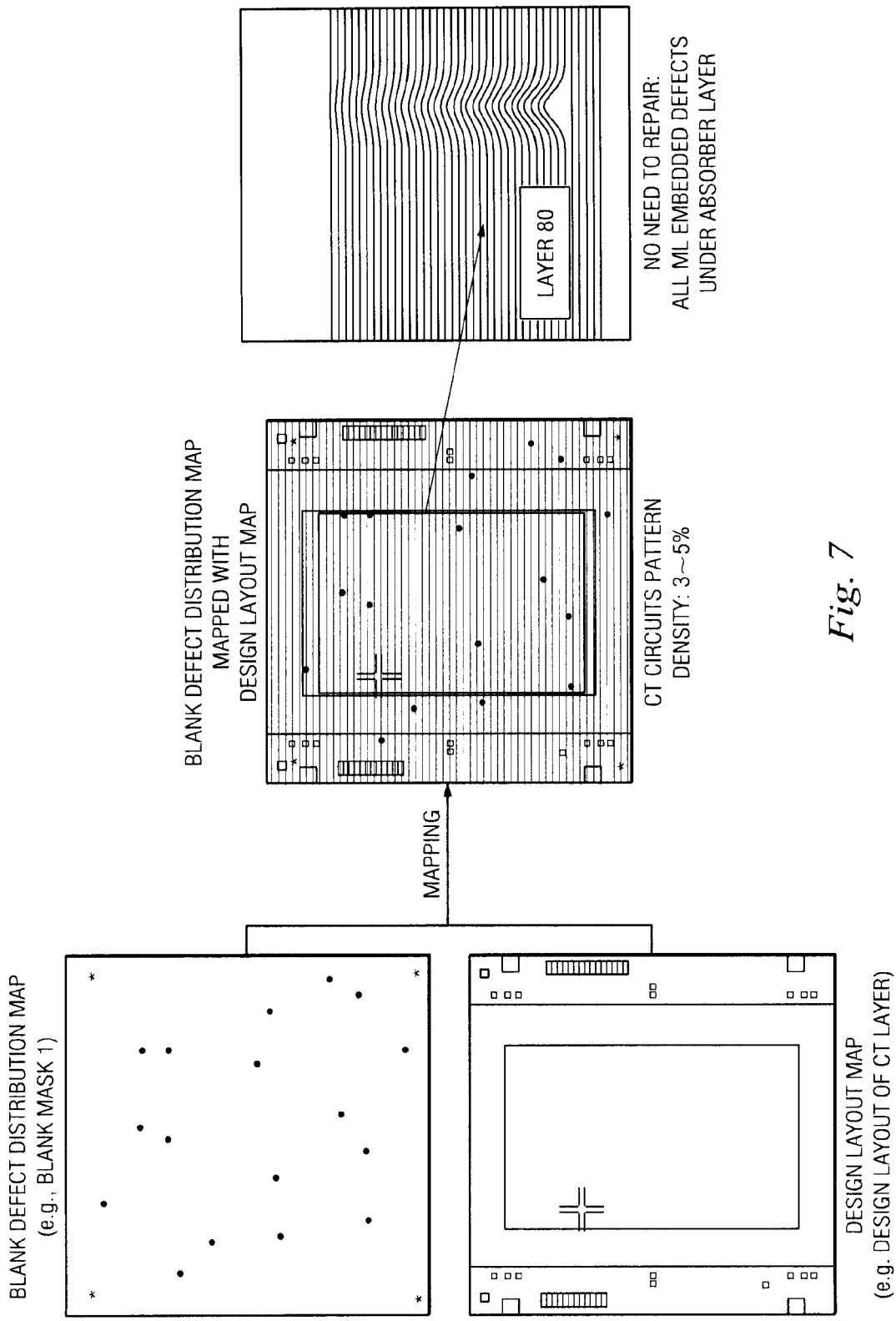

FIGS. 5, 6, and 7 illustrate a method that can be implemented by the system 20 of FIG. 2 according to one or more embodiments of the present disclosure. FIG. 5 provides a method 700 that selects a best suitable blank mask for a design layout. In other words, the method 700 matches a design layout with a blank mask that will minimize defect repair requirements.

At blocks 702 and 704, a plurality of blank mask defect distribution maps and design layouts is provided. For example, as illustrated in FIG. 6, the auto-mapping system 300 accesses the EUV blank defect inspection system 100 (including the EUV blank mask database 110) and design layout management system 200 (including the design layout database 210) to manage the plurality of blank mask defect distribution maps and design layouts. As discussed above, each blank mask defect distribution map provides information (such as location) about defects within a blank mask, and each design layout provides a pattern for a layer of an integrated circuit device.

A tolerance for defects depends on the design layout, particularly the type of layer being patterned on the EUV blank mask. For example, in a design layout for an active or polysilicon layer (i.e., OD/PO layer), pattern density is approximately 25-35% circuit area and 65-75% dummy area. In a design layout for a contact or via layer (i.e., CT/Via layer), pattern density is approximately 3-5% circuit area and 95-97% dummy area. In a design layout for a metal layer, pattern density is approximately 40-50% circuit area and 50-60% dummy area. Accordingly, a blank requirement for a blank mask that will be patterned with an OD/PO layer design layout is a medium blank defect tolerance; a blank requirement for a blank mask that will be patterned with a CT/Via layer design layout is a high blank defect tolerance; and a blank requirement for a blank mask that will be patterned with a metal layer design layout is a low blank defect tolerance. Thus, the more dummy area a design layout includes, the more defects tolerated within the mask.

At blocks 706 and 708, the method 700 implements an auto-mapping process, wherein a best suitable blank mask is selected for each design layout (or specific layer requirement), and generates a repair reference report. The auto-mapping process can effectively and efficiently match each design layout with a blank mask to minimize defects located in circuit areas of the design layouts. This provides optimization between blank masks and design layouts, which can reduce the number of defects requiring repair, and thus, reduce manufacturing time. The repair reference report can indicate defects in each blank mask that need to be repaired, which can be communicated to a mask repair tool.

Referring to FIG. 6, the auto-mapping system 300 implements the auto-mapping process by sorting through the EUV blank defect inspection system 100 and design layout management system 200. The auto-mapping process matches each design layout with an optimal blank mask. As a simple example, referring to FIG. 7, the auto-mapping process maps a blank defect distribution map for a blank mask (Blank Mask 01) with a design layout for a contact (CT) layer. As noted above, a CT layer exhibits a pattern density of approximately 3-5% circuit area, and thus exhibits a high tolerance for being patterned on blank masks with defects. The auto-mapping process may thus determine that though defects exist in Blank Mask 01, these defects occur mostly within a dummy area of the CT layer pattern, so only minimal mask repair will be necessary.

Referring again to FIG. 6, the auto-mapping system 300 compares the plurality of defect distribution maps of the EUV blank masks to the plurality of design layouts that will be patterned on the EUV blank masks. From the comparison, the auto-mapping system 300 matches each design layout with a blank mask, wherein the match provides the least amount of defects within a circuit area of the design layout. For example, the auto-mapping process may determine that a blank mask 16 optimally matches with a design layout TMX123, which provides a pattern for a metal one (M1) layer of an integrated circuit device; a blank mask 81 optimally matches with a design layout TMY736, which provides a pattern for a poly (PO) layer of an integrated circuit device; etc.

The auto-mapping system 300 can also generate the repair reference report, which can provide information about the best suitable blank mask/design layout matches. This information includes defect information associated with the best suitable blank mask/design layout matches. For example, with respect to a single best suitable blank mask/design layout match, the repair reference report indicates where defects in the best suitable blank mask occur with reference to the design layout, such as locations of defects within the circuit and non-circuit (or dummy) areas of the design layout. The repair reference report can be sent to a mask repair system, such as mask repair system 500. Then, after a design layout has been patterned on its best suitable mask blank, the patterned mask can be repaired by the mask repair system 500 according to the reference repair report. More particularly, the mask repair system 500 will be able to selectively repair defects of the mask within the circuit areas based on information provided in the reference repair report.

Figure 8:
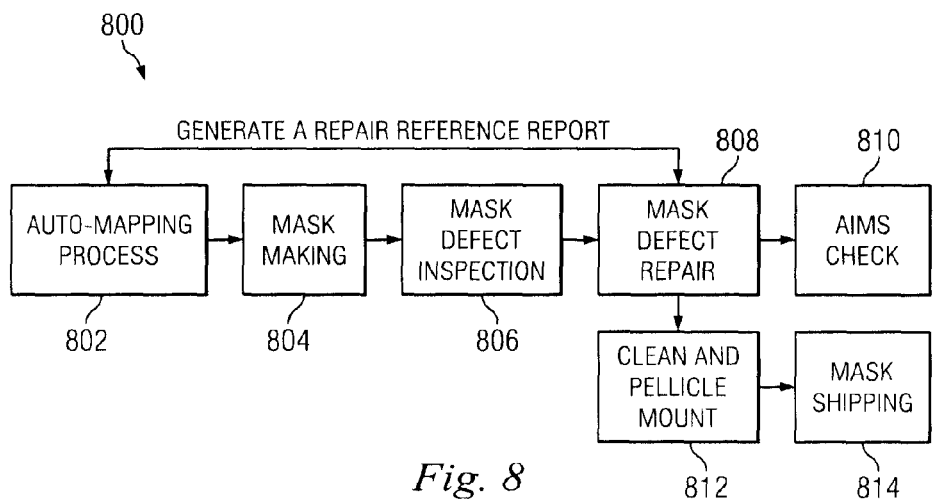

FIG. 8 illustrates a mask making process flow 800 that incorporates the auto-mapping process described herein. The mask making process flow 800 can be implemented by the system 20 of FIG. 2 according to one or more embodiments of the present disclosure. At block 802, an auto-mapping process is performed. The auto-mapping process 800 involves the processes described with reference to FIGS. 3-7 and is performed by the auto-mapping system 300. For illustration purposes, the auto-mapping process 802 selects a best suitable blank mask for a design layout. The auto-mapping process 802 then generates a reference repair report, which indicates defects within the best suitable blank mask that will need to be repaired, for example, defects that will appear within circuit areas of the design layout patterned on the best suitable mask blank. The reference repair report can be sent (or communicated) to a mask repair tool, such as mask repair system 500.

At block 804, a mask making process is performed on a blank mask. For example, a design layout is patterned on the chosen best suitable blank mask. The mask making process can be performed by mask making system 400, which performs various patterning and etching processes to form the design layout pattern on the blank mask. The patterning processes include photoresist coating (e.g., spin-on coating), soft baking, mask aligning, exposure, post-exposure baking, developing the photoresist, rinsing, drying (e.g., hard baking), other suitable processes, and/or combinations thereof. Alternatively, the photolithography exposing process is implemented or replaced by other proper methods such as maskless photolithography, electron-beam writing, and/or ion-beam writing. The etching processes include dry etching, wet etching, and/or other etching methods.

At blocks 806 and 808, the mask (or patterned mask) is then subjected to a mask defect inspection and a mask defect repair process. The mask defect inspection process can include an aerial image measuring system (AIMS) check as illustrated at block 810. The mask defect inspection can also generate a repair reference report and communicate the repair reference report to the mask defect repair process. Once inspected, the mask defect repair process utilizes the repair reference report generated by the auto-mapping process (and/or repair reference report generated by the mask defect inspection process) to correct defects in the mask. At blocks 812 and 814, the mask can then undergo a cleaning process, a pellicle mounting process, and a mask shipping process.

Figure 9:
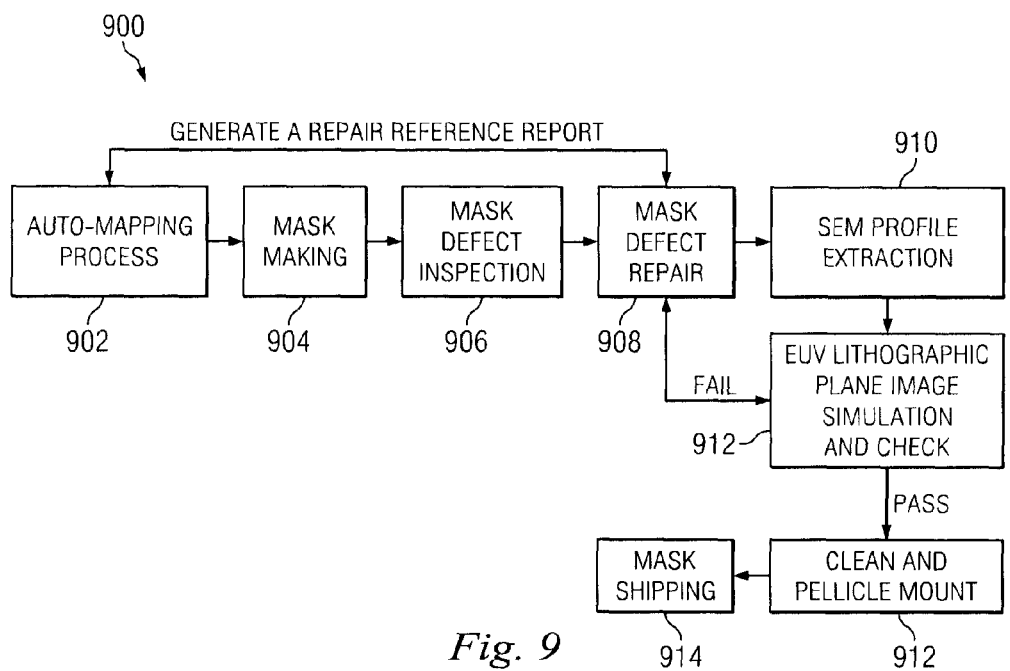
FIG. 9 is illustrates a mask manufacturing process according to one or more embodiments of the present disclosure.

FIG. 9 illustrates a mask making process flow 900 that incorporates the auto-mapping process described herein. The mask making process flow 900 can be implemented by the system 20 of FIG. 2 according to one or more embodiments of the present disclosure. Alternatively, it is understood that the mask making process flow 900 can be performed without incorporating the auto-mapping process described herein.

At blocks 902, 904, 906, and 908, the auto-mapping process, mask making process, mask defect inspection process, and mask defect repair process may be similar to such processes described herein, such as the auto-mapping process, mask making process, mask defect inspection process, and mask defect repair process described with reference to blocks 802, 804, 806, and 808 at FIG. 8. The mask making process flow 900 replaces an AIMS check (such as the AIMS check illustrated at block 810 in FIG. 8) with an SEM profile extraction at block 910 and/or an EUV lithographic plane image simulation/check at block 912 as illustrated in FIG. 9. Replacing the AIMS check (or AIMS optical simulator) with the proposed SEM profile extraction and/or EUV lithographic plane image simulation/check (or S/W image simulator) can reduce manufacturing costs and/or time.

At block 910, the SEM profile extraction can include acquiring mask SEM (scanning electron microscope) images for each defect found in the mask. From the mask SEM images, an SEM extraction algorithm may be used to extract mask profiles from an SEM gray level image to a binary intensity image. The extracted mask SEM images (e.g., binary intensity images) can then be input into a wafer plane image simulator. For example, the extracted mask SEM images can be input at block 912 at the EUV lithographic plane image simulation and check. Here, the wafer plane image simulator can perform a lithographic plane simulation with the extracted mask SEM images. From the lithographic plane simulation, a wafer contour can be determined. From the wafer plane images, a mask defect printability check can be performed. The mask defect printability check can include utilizing a CD metrology algorithm in the wafer plane images. Accordingly, it is possible to use mask SEM image files instead of OPCed design layout files for lithography simulation when checking wafer printing performance. If the check at blocks 910, 912 fails, then the mask may be sent back to the mask repair process at block 908 for further repair. If the check at blocks 910, 912 passes, at blocks 912 and 914, the mask can then undergo a cleaning process, a pellicle mounting process, and a mask shipping process.

The present disclosure can take the form of an entirely hardware embodiment, an entirely software embodiment, or an embodiment containing both hardware and software elements. Furthermore, embodiments of the present disclosure can take the form of a computer program product accessible from a tangible computer-usable or computer-readable medium providing program code for use by or in connection with a computer or any instruction execution system. For the purposes of this description, a tangible computer-usable or computer-readable medium can be any apparatus that can contain, store, communicate, propagate, or transport the program for use by or in connection with the instruction execution system, apparatus, or device. The medium can be an electronic, magnetic, optical, electromagnetic, infrared, a semiconductor system (or apparatus or device), or a propagation medium.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   providing a blank mask and a design layout to be patterned on the blank mask, the design layout including a critical area;
   inspecting the blank mask for defects and thereby generating a defect distribution map associated with the blank mask;
   mapping the defect distribution map to the design layout, wherein the mapping includes:
      aligning the defect distribution map with the design layout;
      determining whether the defects of the blank mask map to the critical area; and
      generating a repair reference report indicating defects that need to be repaired should the design layout be patterned on the blank mask;
   performing a mask making process on the blank mask to produce a patterned mask; and
   performing a mask defect repair process on the patterned mask based on the repair reference report.

2. The method of claim 1 wherein providing the blank mask includes providing a blank mask having multiple reflective layers.

3. The method of claim 1 wherein generating the defect distribution map associated with the blank mask includes indicating at least one of a location, size, and/or depth of a defect in the blank mask.

4. The method of claim 1 further comprising:
   when the defects do not align with the critical area of the design layout, performing the mask making process on the blank mask;
   when the defects do align with the critical area of the design layout, determining whether a number of defects aligning with the critical area falls within an acceptable range; and
   wherein the performing of the mask making process, and the performing of the mask defect repair process are performed when the number of defects aligning with the critical area falls within the acceptable range.

5. The method of claim 4 further comprising:
   when the number of defects aligning with the critical area does not fall within the acceptable range, then:
      selecting another blank mask for the design layout to be patterned thereon; and
      verifying that any defects in the another blank mask that align with the critical area of the design layout are within the acceptable range.

6. A method comprising:
   providing a design layout, the design layout being a pattern for a layer of an integrated circuit device;
   providing a plurality of blank masks, each blank mask being associated with a defect distribution map;
   mapping the design layout to the defect distribution map of each of the plurality of blank masks;
   determining, from the mapping, a number of defects requiring repair should the design layout be patterned on each of the plurality of blank masks;
   selecting, based on the determining, a blank mask of the plurality of blank masks having a least number of defects requiring repair; and
   transferring the design layout to the selected blank mask, thereby fabricating a mask.

7. The method of claim 6 wherein the determining of the number of defects requiring repair includes determining a number of defects in each of the plurality of blank masks that align with a critical area of the design layout, and wherein the selecting of the blank mask is performed such that the selected blank mask has a least number of defects within the critical area of the design layout.

8. The method of claim 6 further comprising:
   generating of a reference repair report that indicates defect information about the selected blank mask; and
   performing of a mask defect repair process on the mask based on the reference repair report.

9. The method of claim 6 further comprising:
   providing of additional design layouts, each design layout being a pattern for a layer of the integrated circuit device; and
   selecting of a suitable blank mask for each additional design layout, wherein the selecting is based on the comparing of the additional design layouts to the defect distribution maps, wherein the suitable blank mask for each additional design layout minimizes overall defect repair requirements.

10. The method of claim 6 wherein the providing of the plurality of blank masks includes providing a plurality of blank masks having multiple reflective layers.

11. The method of claim 6 further including:
   when the transferring of the design layout to the selected blank mask fails, selecting another blank mask from the plurality of blank masks; and
   transferring of the design layout to the selected another blank mask.

12. The method of claim 6 wherein the transferring of the design layout to the selected blank mask, thereby fabricating the mask includes performing a mask writing process on the selected blank mask.

13. The method of claim 12 wherein the performing of the mask writing process includes performing an e-beam writing process.

* * * * *